United States Patent
Matsuoka et al.

(10) Patent No.: US 11,509,234 B2
(45) Date of Patent: Nov. 22, 2022

(54) POWER CONVERSION APPARATUS

(71) Applicant: DENSO CORPORATION, Kariya (JP)

(72) Inventors: Tetsuya Matsuoka, Kariya (JP); Ryota Tanabe, Kariya (JP); Yuu Yamahira, Kariya (JP); Kazuma Fukushima, Kariya (JP); Kosuke Kamiya, Kariya (JP)

(73) Assignee: DENSO CORPORATION, Kariya (JP)

(*) Notice: Subject to any disclaimer, the term of this patent is extended or adjusted under 35 U.S.C. 154(b) by 129 days.

(21) Appl. No.: 16/782,158

(22) Filed: Feb. 5, 2020

(65) Prior Publication Data
US 2020/0177093 A1 Jun. 4, 2020

Related U.S. Application Data

(63) Continuation of application No. PCT/JP2018/027482, filed on Jul. 23, 2018.

(30) Foreign Application Priority Data

Aug. 9, 2017 (JP) .............................. JP2017-154398

(51) Int. Cl.
*H02M 7/00* (2006.01)
*H01L 23/473* (2006.01)
(Continued)

(52) U.S. Cl.
CPC ............ *H02M 7/003* (2013.01); *H01L 23/31* (2013.01); *H01L 23/367* (2013.01);
(Continued)

(58) Field of Classification Search
CPC .............. H02M 7/003; H02M 7/5387; H02M 7/53871; H01L 23/31; H01L 23/367; H01L 23/473; H01L 25/18; H02P 27/06
See application file for complete search history.

(56) References Cited

U.S. PATENT DOCUMENTS 9,179,581 B2 * 11/2015 Suwa ..................... H01L 23/473
2004/0089934 A1 * 5/2004 Shimoida .............. H01L 25/071
257/686
(Continued)

FOREIGN PATENT DOCUMENTS

JP 2008-253055 A 10/2008
JP 2008253055 * 10/2008 .............. H02M 7/48
(Continued)

OTHER PUBLICATIONS

Aug. 28, 2018 Search Report issued in International Patent Application No. PCT/JP2018/027482.

*Primary Examiner* — S M Sohel Imtiaz
(74) *Attorney, Agent, or Firm* — Oliff PLC

(57) ABSTRACT

A power conversion apparatus has a positive electrode bus bar and a negative electrode bus bar. The power conversion apparatus has a first semiconductor module incorporating an upper-arm switching element and including a positive electrode terminal and a second semiconductor module incorporating a lower-arm switching element and including a negative electrode terminal. The first semiconductor module and the second semiconductor module are placed such that the positive electrode terminal and the negative electrode terminal face each other in a direction orthogonal to a protruding direction. The positive electrode bus bar and the negative electrode bus bar respectively have coexisting parts placed together between the positive electrode terminal and the negative electrode terminal as seen in the protruding direction of power terminals. The coexisting parts are at least partially placed in a space between the positive electrode terminal and the negative electrode terminal.

14 Claims, 10 Drawing Sheets

(51) Int. Cl.
*H01L 25/18* (2006.01)
*H02M 7/5387* (2007.01)
*H01L 23/367* (2006.01)
*H01L 23/31* (2006.01)
*H02P 27/06* (2006.01)

(52) U.S. Cl.
CPC ............ *H01L 23/473* (2013.01); *H01L 25/18* (2013.01); *H02M 7/5387* (2013.01); *H02P 27/06* (2013.01)

(56) References Cited

U.S. PATENT DOCUMENTS

| | | | | |
|---|---|---|---|---|
| 2011/0310585 | A1* | 12/2011 | Suwa | H01L 24/36 361/820 |
| 2013/0272046 | A1* | 10/2013 | Matsuoka | H01L 24/33 363/132 |
| 2015/0131232 | A1* | 5/2015 | Ishino | H05K 1/11 361/707 |
| 2015/0195957 | A1* | 7/2015 | Ohoka | H05K 7/1432 361/702 |
| 2016/0226396 | A1* | 8/2016 | Hattori | H05K 7/1432 |
| 2016/0254206 | A1* | 9/2016 | Ohno | H01L 23/40 363/132 |

FOREIGN PATENT DOCUMENTS

| | | | | |
|---|---|---|---|---|
| JP | 2015-015787 A | | 1/2015 | |
| JP | 2015-136224 A | | 7/2015 | |
| JP | 2015136224 A | * | 7/2015 | ............. H02M 7/48 |
| JP | 2015-149833 A | | 8/2015 | |

* cited by examiner

POWER CONVERSION APPARATUS

CROSS-REFERENCE TO RELATED APPLICATION

The present application is based on and claims the benefit of priority from Japanese Patent Application No. 2017-154398 filed on Aug. 9, 2017, the description of which is incorporated herein by reference.

BACKGROUND

Technical Field

The present disclosure relates to a power conversion apparatus including a plurality of semiconductor modules.

Related Art

A power conversion apparatus is known in which a semiconductor module incorporating an upper-arm switching element and a semiconductor module incorporating a lower-arm switching element are placed so as to be adjacent to each other. In this power conversion apparatus, the positive electrode terminal of an upper-arm semiconductor module connected to a positive electrode bus bar and the negative electrode terminal of a lower-arm semiconductor module connected to a negative electrode bus bar are placed so as to be adjacent to each other.

The positive electrode bus bar includes terminals protruding and connected to positive electrode terminals. The negative electrode bus bar includes terminals protruding and connected to negative electrode terminals. These terminals are individually placed between every adjacent positive and negative electrode terminal.

SUMMARY

As an aspect of the present disclosure, a power conversion apparatus is provided which includes a switching circuit unit having a plurality of upper-arm switching elements connected to a positive electrode wiring and a plurality of lower-arm switching elements connected to a negative electrode wiring. The power conversion apparatus includes: a plurality of bus bars; and a plurality of semiconductor modules each including power terminals protruding from a module body.

As the bus bars, a positive electrode bus bar that configures the positive electrode wiring and a negative electrode bus bar that configures the negative electrode wiring are provided.

As the semiconductor modules, a first semiconductor module and a second semiconductor module are provided, the first semiconductor module incorporating one of the upper-arm switching elements and including a positive electrode terminal that is the power terminal connected to the positive electrode bus bar, the second semiconductor module incorporating one of the lower-arm switching elements and including a negative electrode terminal that is the power terminal connected to the negative electrode bus bar.

The first semiconductor module and the second semiconductor module are placed such that the positive electrode terminal and the negative electrode terminal face each other in a direction orthogonal to a protruding direction.

The positive electrode bus bar and the negative electrode bus bar respectively have coexisting parts placed together between the positive electrode terminal and the negative electrode terminal as seen in the protruding direction of the power terminals.

The coexisting parts are at least partially placed in a space between the positive electrode terminal and the negative electrode terminal.

The power conversion apparatus further includes an output bus bar that configures an output wiring.

The semiconductor modules each include an output terminal connected to the output bus bar as one of the power terminals.

The output terminals of the first semiconductor module and the second semiconductor module face each other.

The output bus bar has an output interposition part placed in a space between the output terminals which face each other.

Both the output terminal of the first semiconductor module and the output terminal of the second semiconductor module are connected to the output interposition part.

DETAILED DESCRIPTION OF THE PREFERRED EMBODIMENTS

JP 2013-219967 A discloses a power conversion apparatus in which a semiconductor module incorporating an upper-arm switching element and a semiconductor module incorporating a lower-arm switching element are placed so as to be adjacent to each other. In this power conversion apparatus, the positive electrode terminal of an upper-arm semiconductor module connected to a positive electrode bus bar and the negative electrode terminal of a lower-arm semiconductor module connected to a negative electrode bus bar are placed so as to be adjacent to each other.

The positive electrode bus bar includes terminals protruding and connected to positive electrode terminals. The negative electrode bus bar includes terminals protruding and connected to negative electrode terminals. These terminals are individually placed between every adjacent positive and negative electrode terminal.

In the case of the above arrangement of the terminals of the positive and negative electrode bus bars, it is difficult to sufficiently reduce the inductance of each terminal part. In addition, the recent demand for power conversion apparatuses capable of reducing switching loss has accelerated the need for high-speed switching, which requires reduction in the inductance of bus bars. Thus, reducing the inductance of bus bars and connections between the bus bars and semiconductor modules has been regarded as an important issue.

An object of the present disclosure is to provide a power conversion apparatus that can easily reduce inductance.

First Embodiment

An embodiment of a power conversion apparatus will be described with reference to FIGS. 1 to 8.

Figure 2:
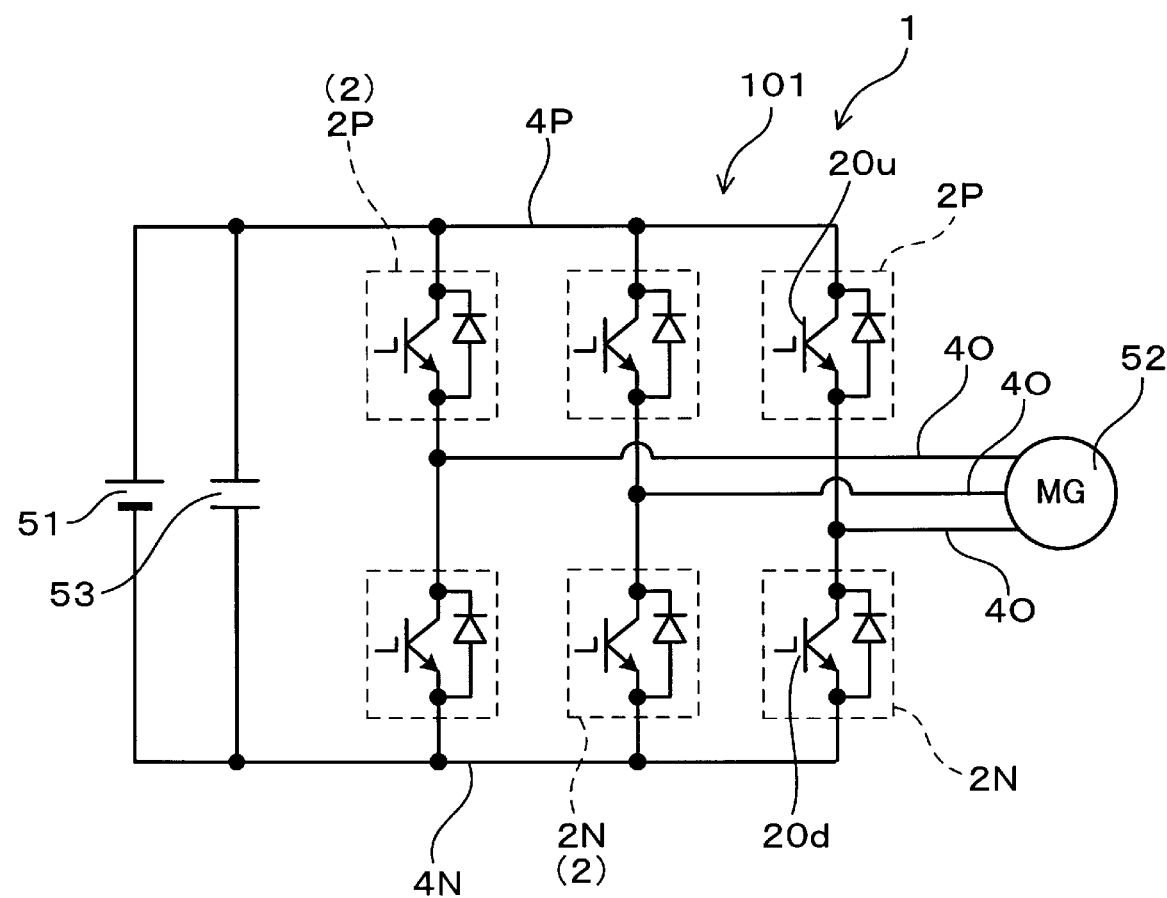
FIG. 2 is a circuit diagram of the power conversion apparatus according to the first embodiment.

As illustrated in FIG. 2, a power conversion apparatus 1 according to the present embodiment includes a switching circuit unit 101 having a plurality of upper-arm switching elements 20u connected to a positive electrode wiring and a plurality of lower-arm switching elements 20d connected to a negative electrode wiring.

Figure 1:
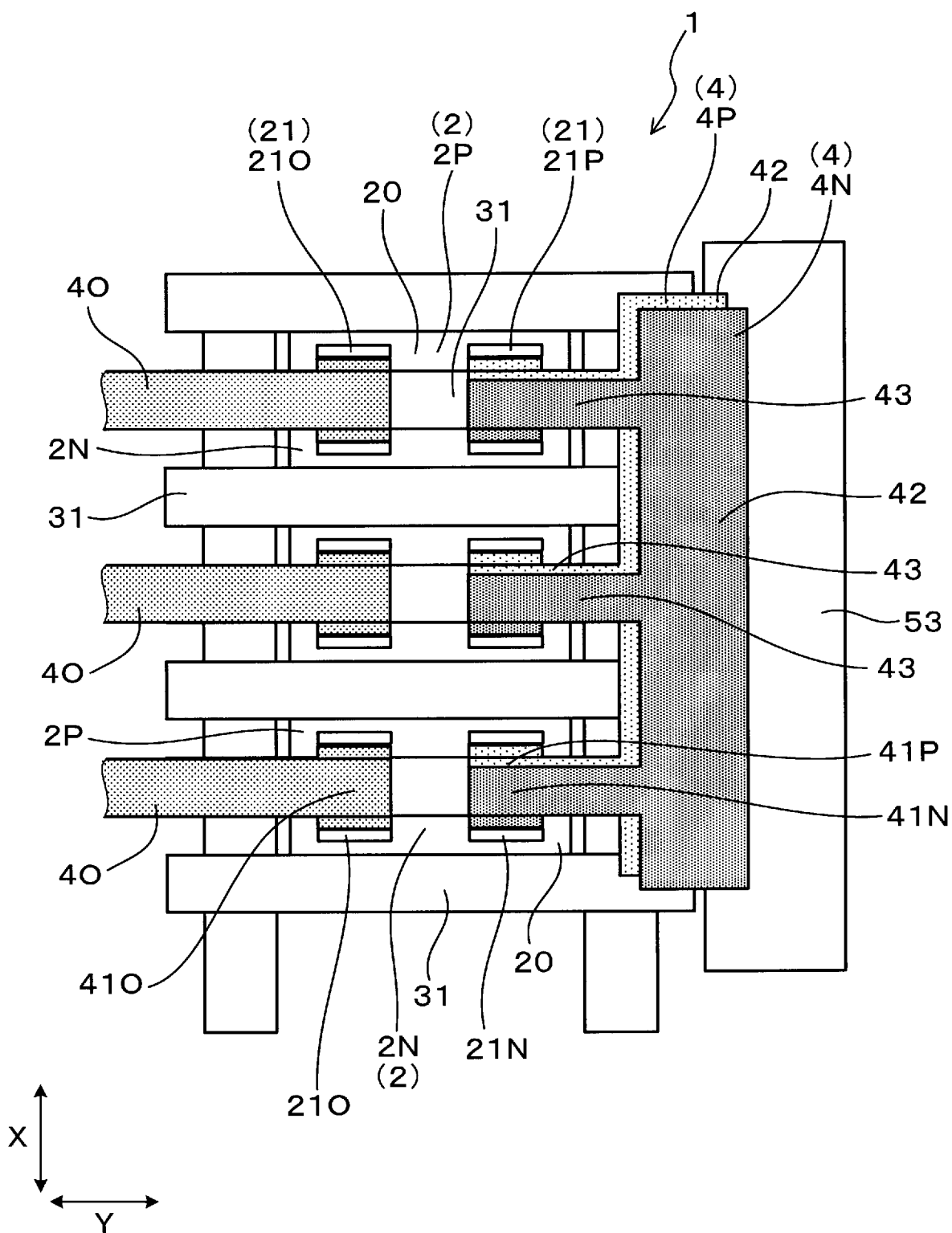
FIG. 1 is a plan view of a power conversion apparatus according to the first embodiment.

As illustrated in FIG. 1, the power conversion apparatus 1 has a plurality of bus bars 4 and a plurality of semiconductor modules 2 each including power terminals 21 protruding from a module body 20.

The power conversion apparatus 1 has, as the bus bars 4, a positive electrode bus bar 4P that constitutes the positive electrode wiring and a negative electrode bus bar 4N that constitutes the negative electrode wiring.

The power conversion apparatus 1 has, as the semiconductor modules 2, first semiconductor modules 2P and second semiconductor modules 2N.

As illustrated in FIGS. 2 to 5, each of the first semiconductor modules 2P incorporates one of the upper-arm switching elements 20u. The first semiconductor module 2P also includes a positive electrode terminal 21P that is the power terminal 21 connected to the positive electrode bus bar 4P. As illustrated in FIGS. 2 to 4 and 6, each of the second semiconductor modules 2N incorporates one of the lower-arm switching elements 20d. The second semiconductor module 2N also includes a negative electrode terminal 21N that is the power terminal 21 connected to the negative electrode bus bar 4N.

Figure 3:
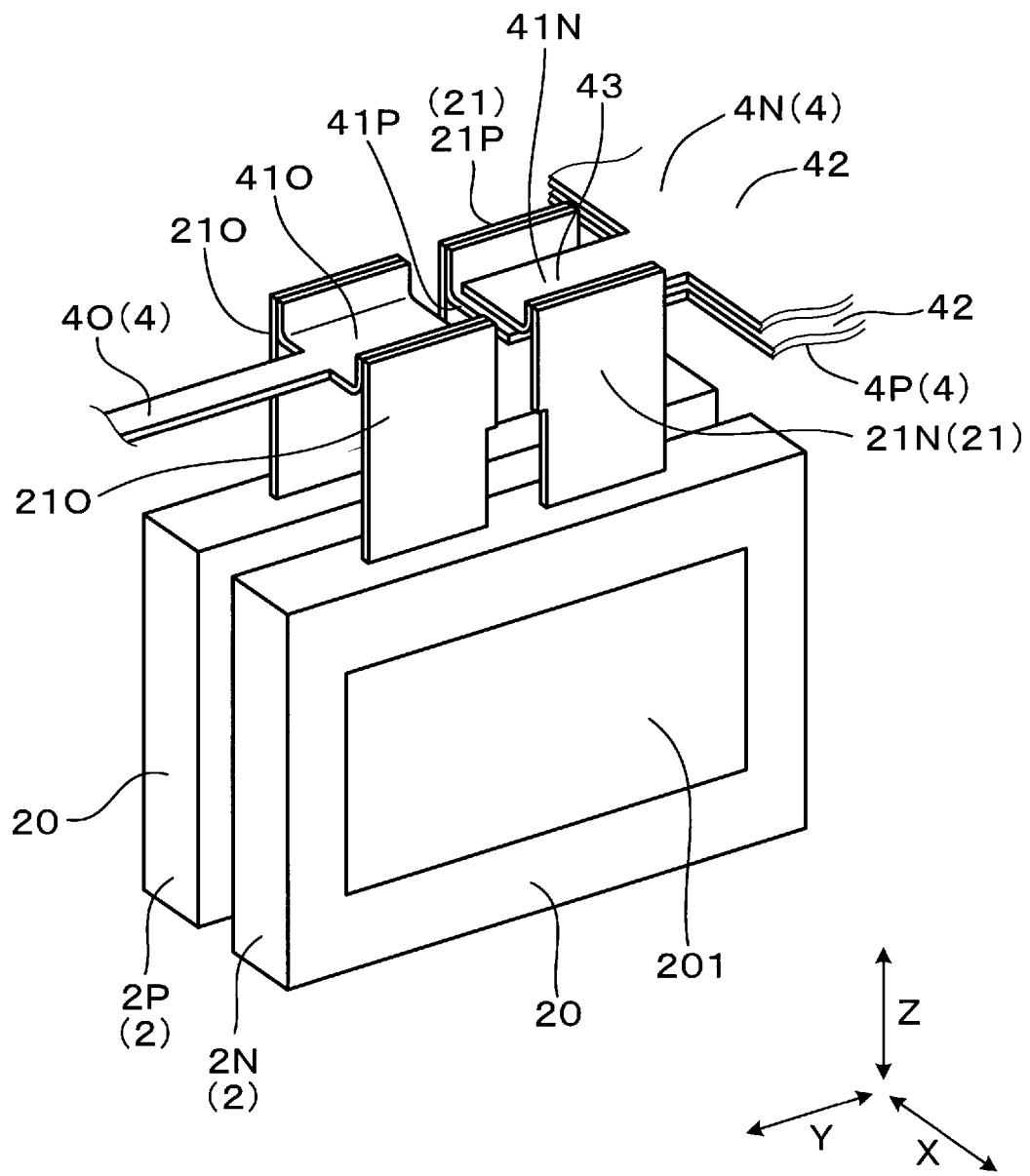
FIG. 3 is a perspective view of semiconductor modules and bus bars according to the first embodiment.
Figure 4:
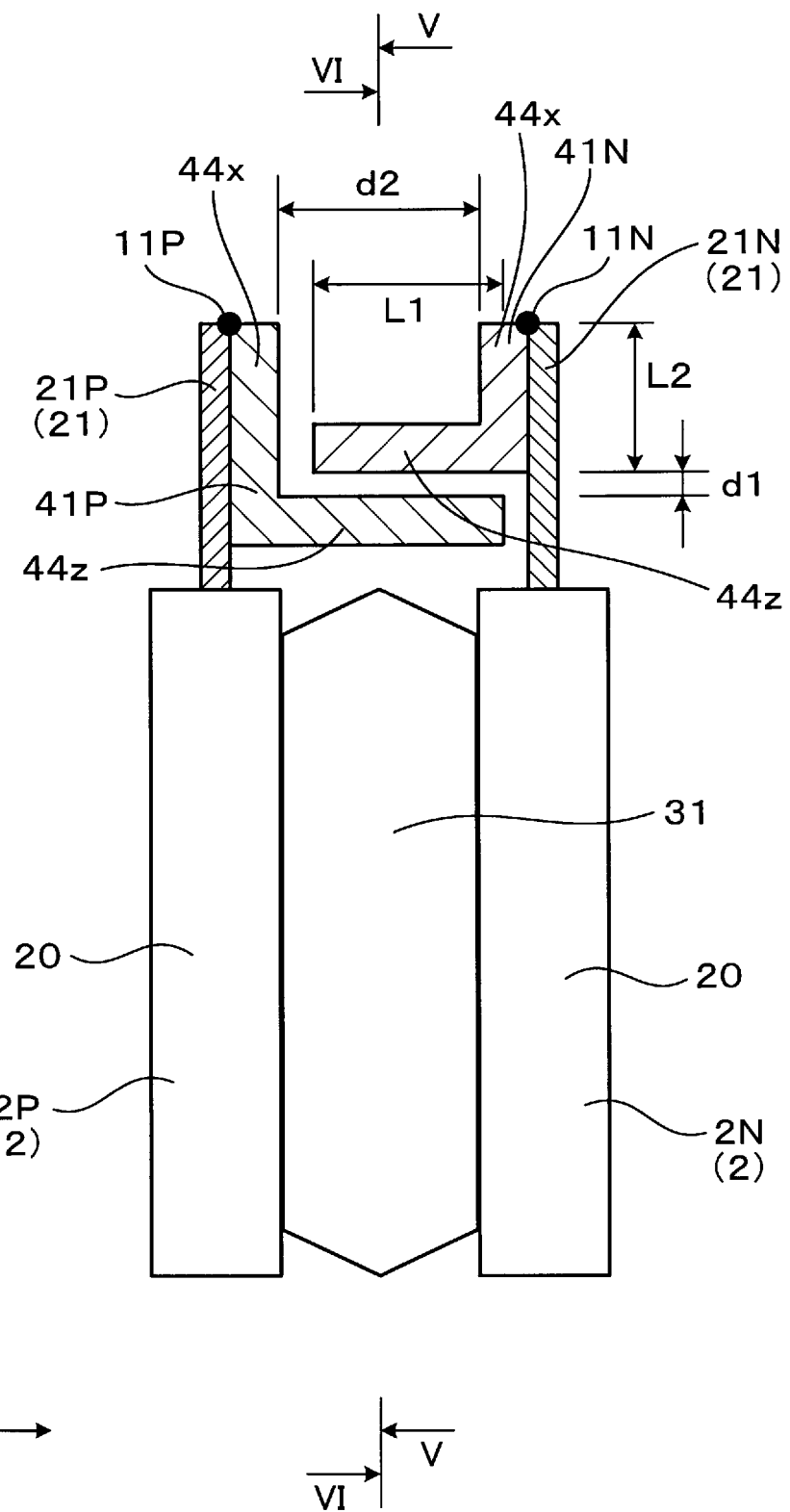
FIG. 4 is a cross-sectional view of semiconductor modules and coexisting parts according to the first embodiment.

As illustrated in FIGS. 3 and 4, the first semiconductor module 2P and the second semiconductor module 2N are placed such that the positive electrode terminal 21P and the negative electrode terminal 21N face each other in a direction orthogonal to the protruding direction thereof.

The positive electrode bus bar 4P and the negative electrode bus bar 4N respectively have coexisting parts 41P and 41N. The coexisting parts 41P and 41N are portions placed together between the positive electrode terminal 21P and the negative electrode terminal 21N as seen in the protruding direction of the power terminals 21, as illustrated in FIG. 1.

The coexisting parts 41P and 41N are at least partially placed in the space between the positive electrode terminal 21P and the negative electrode terminal 21N. In particular, in the present embodiment, the coexisting parts 41P and 41N are placed in the space between the positive electrode terminal 21P and the negative electrode terminal 21N in their entirety.

Hereinafter, the direction parallel with the protruding direction of the power terminals 21 may also be referred to as the Z direction. The direction in which the positive electrode terminal 21P and the negative electrode terminal 21N face each other may also be referred to as the X direction. The direction orthogonal to both the X direction and the Z direction may also be referred to as the Y direction.

The power conversion apparatus 1 according to the present embodiment is, for example, an inverter that is mounted in a vehicle. As illustrated in FIG. 2, the power conversion apparatus 1 converts DC power to AC power between a DC power source 51 and a three-phase AC rotating electrical machine 52. The switching circuit unit 101 of the power conversion apparatus 1 includes three-phase legs. Specifically, the three-phase legs are connected in parallel with each other between the positive electrode wiring connected to the positive electrode of the DC power source 51 and the negative electrode wiring connected to the negative electrode of the DC power source 51. Each leg includes one upper-arm switching element 20u and one lower-arm switching element 20d connected in series.

The point of connection between the upper-arm switching element 20u and the lower-arm switching element 20d in each leg is connected to the corresponding one of the three electrodes of the rotating electrical machine 52 via each output wiring. Between the DC power source 51 and the switching circuit unit 101, a capacitor 53 is connected so as to link the positive electrode wiring and the negative electrode wiring together. A freewheeling diode is connected in antiparallel with each switching element.

Note that the switching element can be formed using an IGBT. IGBT is an abbreviation for Insulated Gate Bipolar Transistor.

Alternatively, the switching element can be a MOSFET. MOSFET is an abbreviation for Metal Oxide Semiconductor Field Effect Transistor.

As described above, the positive electrode wiring is formed using the positive electrode bus bar 4P. The negative electrode wiring is formed using the negative electrode bus bar 4N. The output wirings are formed using output bus bars 4O.

Figure 5:
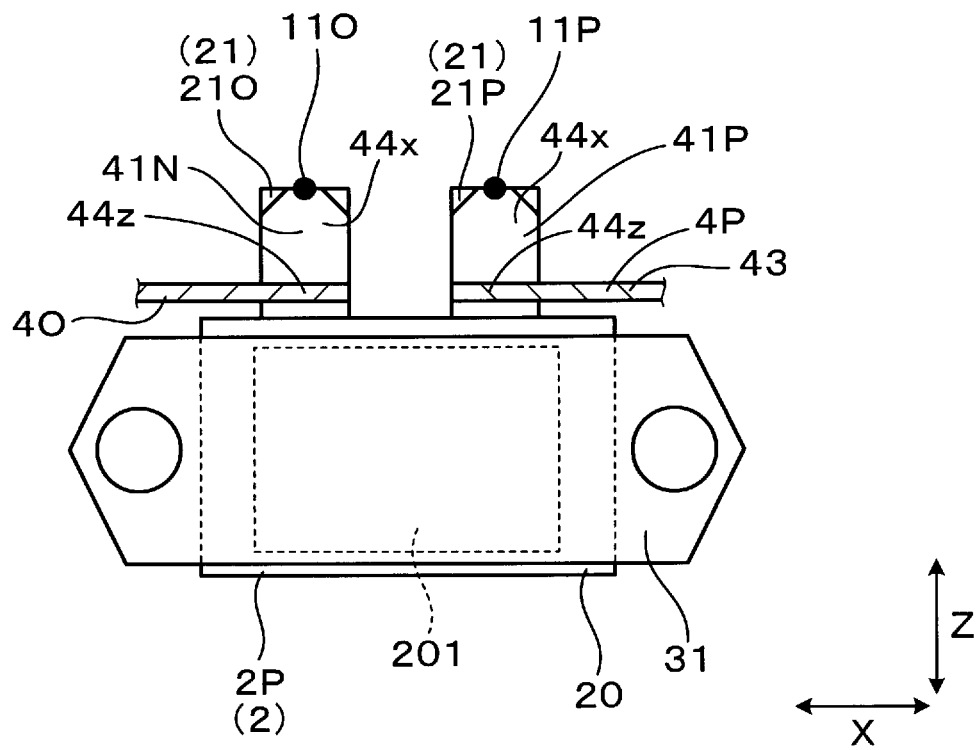
FIG. 5 is a cross-sectional view taken across a line V☐V in FIG. 4.
Figure 6:
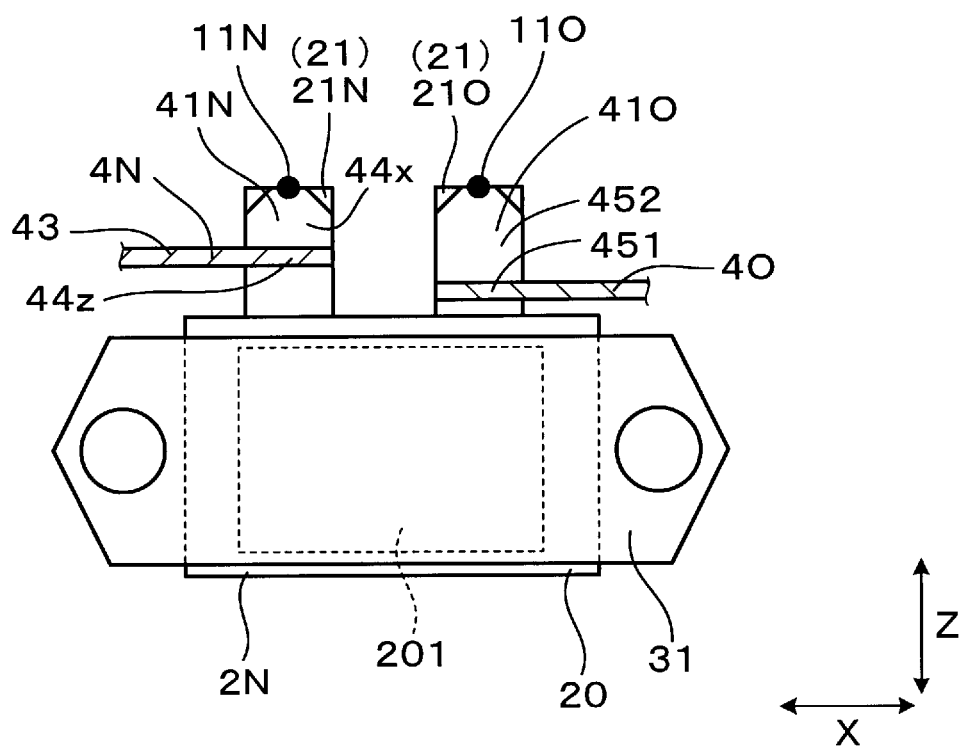
FIG. 6 is a cross-sectional view taken across a line VI☐VI in FIG. 4.

Each semiconductor module 2 has two power terminals 21. As illustrated in FIG. 5, the first semiconductor module 2P has the positive electrode terminal 21P and an output terminal 21O as the power terminals 21. As illustrated in FIG. 6, the second semiconductor module 2N has the negative electrode terminal 21N and an output terminal 21O as the power terminals 21.

As illustrated in FIG. 2, each of the upper-arm switching elements 20u and the lower-arm switching elements 20d is incorporated in each individual semiconductor module 2. In particular, in the present embodiment, one upper-arm switching element 20u is incorporated in one first semiconductor module 2P, and one lower-arm switching element 20d is incorporated in one second semiconductor module 2N. Therefore, in the first semiconductor module 2P, the positive electrode terminal 21P has the same electric potential as that of the collector of the upper-arm switching element 20u, and the output terminal 21O has the same electric potential as that of the emitter of the upper-arm switching element 20u. In the second semiconductor module 2N, the output terminal 21O has the same electric potential as that of the collector of the lower-arm switching element 20d, and the negative electrode terminal 21N has the same electric potential as that of the emitter of the lower-arm switching element 20d.

As illustrated in FIGS. 3 to 7, each semiconductor module 2 has the module body 20 having a substantially rectangular parallelepiped shape. The module body 20 includes a pair of main surfaces having a larger area than those of the other surfaces. The plurality of semiconductor modules 2 are stacked in the normal direction of the main surfaces (see FIG. 8). The power terminals 21 of the semiconductor module 2 have substantially plate-like shapes. The main surfaces of the power terminals 21 are substantially parallel with the main surfaces of the module body 20. In other words, both the main surfaces of the module body 20 and the main surfaces of the power terminals 21 face in the X direction described above.

Each semiconductor module 2 includes two power terminals 21 protruding from the module body 20 in the same orientation along the Z direction. The semiconductor module 2 may also include a control terminal (not illustrated) protruding away from the power terminals 21 in the Z direction. The module body 20 includes heatsinks 201 exposed on both main surfaces thereof. The first semiconductor module 2P and the second semiconductor module 2N are placed such that their heatsinks 201 face each other.

Figure 8:
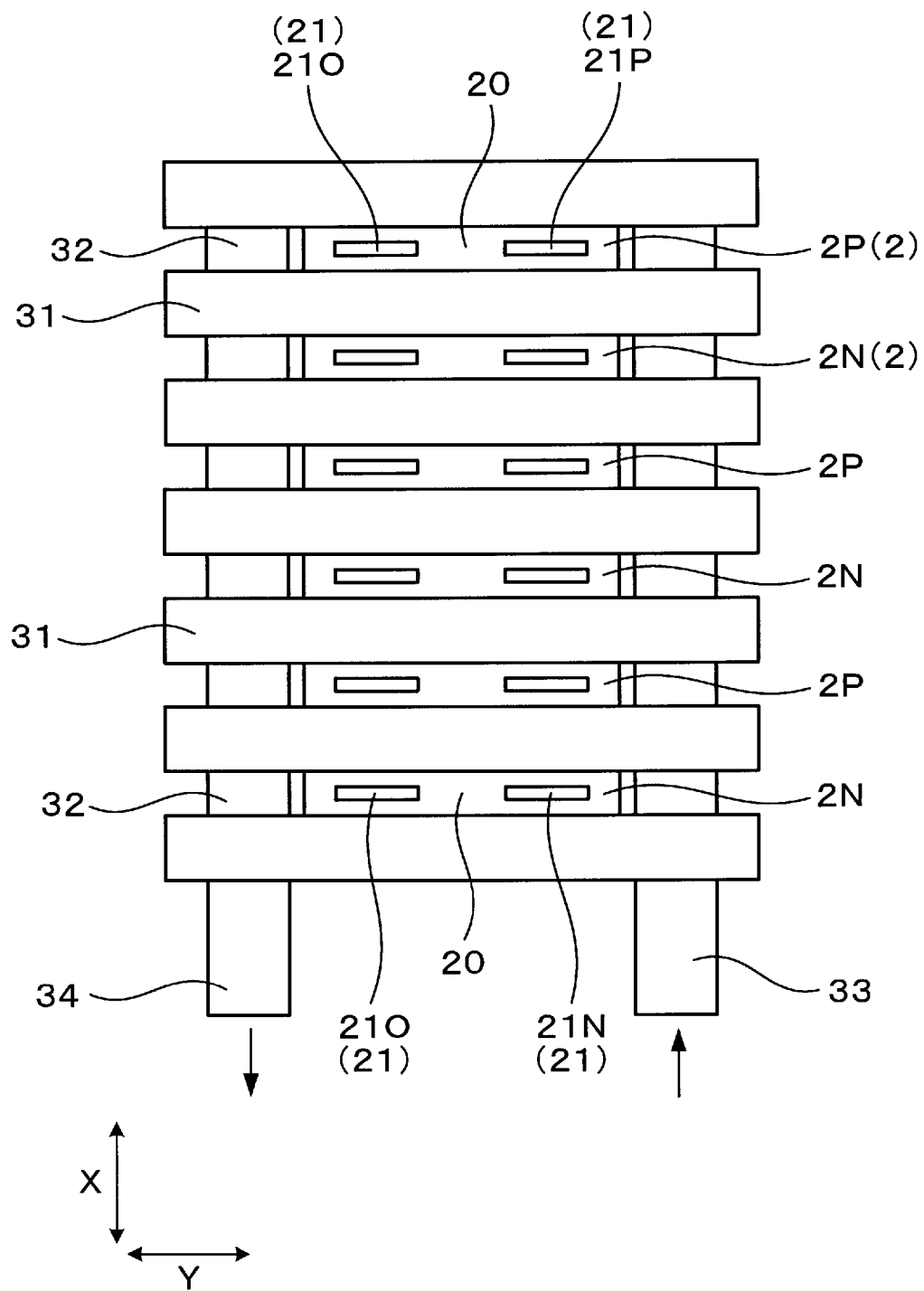
FIG. 8 is a plan view of the power conversion apparatus without bus bars according to the first embodiment.

As illustrated in FIG. 8, the plurality of semiconductor modules 2 are stacked in the X direction together with a plurality of cooling pipes 31 such that the first semiconductor modules 2P and the second semiconductor modules 2N are alternately arranged. The cooling pipes 31 are placed in thermal contact with the heatsinks 201 of the semiconductor modules 2.

The cooling pipes 31 each include an internal refrigerant flow channel through which a refrigerant flows. The cooling pipes 31 adjacent to each other in the X direction are connected by coupling pipes 32 in the vicinity of the two Y-directional ends. The cooling pipe 31 placed at one X-directional end is provided with a refrigerant inlet pipe 33 that introduces a refrigerant and a refrigerant outlet pipe 34 that discharges the refrigerant. Each cooling pipe 31 is made of highly heat conductive metal such as an aluminum alloy. The power terminals 21 of the semiconductor modules 2 protrude further in the Z direction than the cooling pipes 31. The power terminals 21 of the plurality of semiconductor modules 2 protrude on the same side in the Z direction.

As illustrated in FIG. 1, the capacitor 53 is placed on one Y-directional side of the stack of semiconductor modules 2. The two power terminals 21 of each semiconductor module 2 are arranged such that the positive electrode terminal 21P or the negative electrode terminal 21N is closer to the capacitor 53 in the Y direction than the output terminal 21O is.

The output bus bars 4O are connected to the output terminals 21O. Each output bus bar 4O is connected to both the output terminals 21O of the first semiconductor module 2P and the second semiconductor module 2N adjacent to each other in the X direction.

The output bus bars 4O extend in the lateral direction Y from the connections with the output terminals 21O.

The positive electrode bus bar 4P and the negative electrode bus bar 4N are placed such that the positive and negative electrodes of the capacitor 53 are connected to the power terminals 21 of the semiconductor modules 2. Note that the positive electrode bus bar 4P and the negative electrode bus bar 4N are integrated with the capacitor 53. The positive electrode bus bar 4P and the negative electrode bus bar 4N each have a body plate 42 and a plurality of branches 43. The body plates 42 of the positive electrode bus bar 4P and the negative electrode bus bar 4N overlap each other in the Z direction. The branches 43 extend from the body plates 42 toward the power terminals 21 in the Y direction. The branches 43 partially serve as the above-mentioned coexisting parts 41P and 41N.

Each of the branches 43 is connected to one positive electrode terminal 21P and one negative electrode terminal 21N adjacent to each other in the X direction. The coexisting parts 41P and 41N are placed between the semiconductor modules 2 on the first and second levels, between the semiconductor modules 2 on the third and fourth levels, and between the semiconductor modules 2 on the fifth and sixth levels from one X-directional end. Thus, not all the spaces between the power terminals 21 adjacent to each other in the X direction contain the coexisting parts 41P and 41N.

As illustrated in FIG. 4, the coexisting parts 41P and 41N have facing parts that are placed such that main surfaces thereof face each other. The coexisting parts 41P and 41N have, as the facing parts, arrangement facing parts 44x that face each other in the arrangement direction of the positive electrode terminal 21P and the negative electrode terminal 21N, that is, the X direction. The coexisting parts 41P and 41N also have, as the facing parts, protruding facing parts 44z that face each other in the protruding direction of the power terminals 21, that is, the Z direction. In short, in the present embodiment, the coexisting parts 41P and 41N have both the arrangement facing parts 44x and the protruding facing parts 44z as the facing parts.

The coexisting parts 41P and 41N have substantially L shapes in their cross sections orthogonal to the Y direction. One X-directional edge of the end of each branch 43 of each bus bar 4 is bent in one orientation along the Z direction, whereby the coexisting parts 41P and 41N are formed. The portions erecting in the Z direction are the arrangement facing parts 44x. Portions of the branches 43 whose main surfaces face in the Z direction are formed as the protruding facing parts 44z. The erecting direction of the arrangement facing parts 44x from the protruding facing parts 44z is the same as the protruding direction of the power terminals 21.

The distance d1 between the protruding facing parts 44z of a pair of coexisting parts 41P and 41N is smaller than the distance d2 between the arrangement facing parts 44x of the pair of coexisting parts 41P and 41N. The distance d1 is the distance between the protruding facing part 44z of the coexisting part 41P of the positive electrode bus bar 4P and the protruding facing part 44z of the coexisting part 41N of the negative electrode bus bar 4N. The distance d2 is the distance between the arrangement facing part 44x of the coexisting part 41P of the positive electrode bus bar 4P and the arrangement facing part 44x of the coexisting part 41N of the negative electrode bus bar 4N. These distances d1 and d2 have a relationship of d2>d1.

The length L1 of the protruding facing parts 44z in the arrangement direction of the positive electrode terminal 21P and the negative electrode terminal 21N, that is, the X direction, is longer than the length L2 of the arrangement facing parts 44x in the protruding direction of the power terminals 21, that is, the Z direction.

At one of a pair of coexisting parts 41P and 41N whose protruding facing part 44z is closer to the module body 20 than the protruding facing part 44z of the other coexisting part is, the protruding facing part 44z is placed closer to the module body 20 than the connection with the power terminal 21 is. In the present embodiment, the protruding facing part 44z of the coexisting part 41P of the positive electrode bus bar 4P is placed closer to the module body 20 than that of the coexisting part 41N is. Therefore, the protruding facing part 44z of the coexisting part 41P of the positive electrode bus bar 4P is closer to the module body 20 than a connection 11P is.

On each bus bar 4, the arrangement facing part 44x overlaps the power terminal 21 in the X direction. Then, the end of the power terminal 21 and the end of the arrangement facing part 44x are welded together. This welded portion is the connection 11P or 11N. An example method of the welding can be laser welding.

The connection 11P between the positive electrode bus bar 4P and the positive electrode terminal 21P on the coexisting parts 41P and 41N and the connection 11N between the negative electrode bus bar 4N and the negative electrode terminal 21N on the coexisting parts 41P and 41N are equivalent in Z-directional position. Here, ☐ equivalent in Z-directional position ☐ can mean, for example, that the difference between the Z-directional positions of the connections 11P and 11N is substantially equal to or less than the thickness of the bus bars 4.

Figure 7:
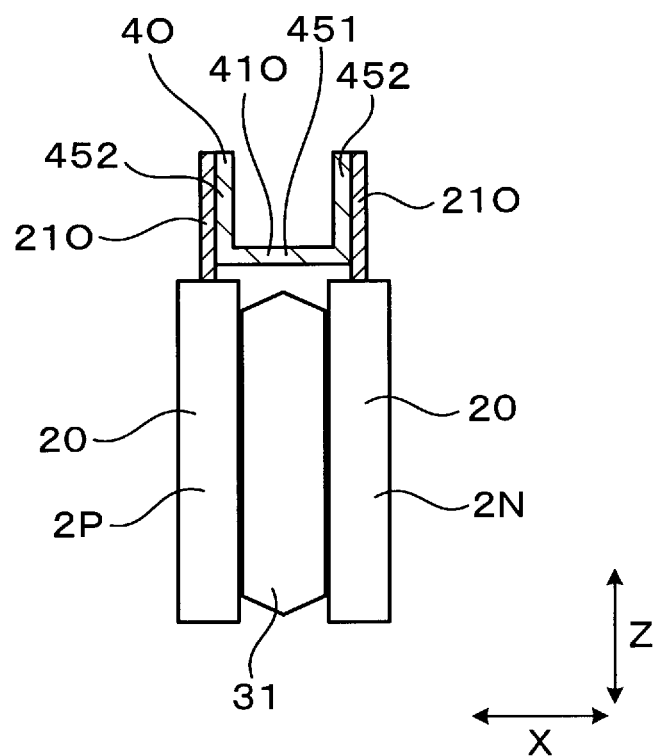
FIG. 7 is a cross-sectional view of semiconductor modules and an output interposition part according to the first embodiment.

As illustrated in FIGS. 1 and 7, the output terminals 21O of the first semiconductor module 2P and the second semiconductor module 2N face each other. Each output bus bar 4O has an output interposition part 41O placed in the space between the output terminals 21O which face each other. Both the output terminal 21O of the first semiconductor module 2P and the output terminal 21O of the second semiconductor module 2N are connected to the output interposition part 41O.

As illustrated in FIGS. 5 and 6, the output interposition part 41O and the coexisting parts 41P and 41N placed between the first semiconductor module 2P and the second semiconductor module 2N adjacent to each other have connections 11O, 11P, and 11N with the corresponding power terminals 21 at equivalent positions in the Z direction. In particular, it is preferable that all the connections 11O, 11P, and 11N between the power terminals 21 and the bus bars 4 be placed in equivalent positions in the Z direction.

The output interposition part 41O has a base 451 and a pair of erecting parts 452. The base 451 has a main surface facing in the Z direction. The erecting parts 452 erect in the protruding direction of the power terminals 21 from the base 451. The base 451 is closer in the Z direction to the module bodies 20 than to the ends of the output terminals 21O.

Next, the effects of the present embodiment will be described.

In the above-described power conversion apparatus 1, as illustrated in FIGS. 1, 3, and 4, the positive electrode bus bar 4P and the negative electrode bus bar 4N respectively have the coexisting parts 41P and 41N. The coexisting parts 41P and 41N at least partially coexist in the space between the positive electrode terminal 21P and the negative electrode terminal 21N which face each other. With this configuration, the positive electrode bus bar 4P and the negative electrode bus bar 4N are placed so as to be close to each other at the coexisting parts 41P and 41N. As a result, the inductance of the bus bars 4 can be reduced.

The coexisting parts 41P and 41N have the facing parts 44x and 44z. Consequently, currents in opposite directions flow through the facing parts of the positive electrode bus bar 4P and the negative electrode bus bar 4N. Therefore, the inductance can be more effectively reduced by the facing parts that face each other.

The coexisting parts 41P and 41N have the arrangement facing parts 44x as facing parts. Consequently, the bus bars 4 are easily connected to the corresponding power terminals 21 at the arrangement facing parts 44x.

The coexisting parts 41P and 41N have the protruding facing parts 44z as facing parts. Consequently, the coexisting parts 41P and 41N are easily placed so as to be close to each other over a wide area. This facilitates the reduction of the inductance.

In particular, the present embodiment provides both the arrangement facing parts 44x and the protruding facing parts 44z as the facing parts. Consequently, the above two effects can be obtained simultaneously. Specifically, the structure of connections between the bus bars 4 and the power terminals 21 can be simplified, and the inductance can be effectively reduced.

The distance d1 between the protruding facing parts 44z of a pair of coexisting parts 41P and 41N is smaller than the distance d2 between the arrangement facing parts 44x of the pair of coexisting parts 41P and 41N. Consequently, the coexisting parts 41P and 41N can be placed sufficiently close to each other, regardless of how large the distance between the power terminals 21 adjacent to each other in the X direction is. Thus, the inductance can be easily reduced.

The length L1 of the protruding facing parts 44z in the X direction is longer than the length L2 of the arrangement facing parts 44x in the Z direction. Consequently, the facing area of the protruding facing parts 44z, which are easily placed so as to be close to each other, can be increased. As a result, the inductance can be more effectively reduced. In addition, the length of the coexisting parts 41P and 41N in the Z direction can be reduced, which can contribute to reducing the size of the power conversion apparatus 1.

At the coexisting part 41P, whose protruding facing part 44z is closer to the module body 20 than that of the coexisting part 41N is, the protruding facing part 44z is placed closer to the module body 20 than the connection 11P is. Consequently, the current loop formed by the switching element and internal wirings inside the module body 20, the coexisting part 41P, and the power terminal 21 can be reduced in length. As a result, the inductance can be reduced.

The cooling pipes 31 are interposed between the first semiconductor modules 2P and the second semiconductor modules 2N placed so as to be adjacent to each other. Consequently, the semiconductor modules 2 can be effectively cooled. The coexisting parts 41P and 41N are placed in the dead space formed in the X direction between the power terminals 21 by the cooling pipes 31 interposed. Therefore, the placement of the coexisting parts 41P and 41N itself does not hinder the reduction of the size of the power conversion apparatus 1.

The connection 11P between the positive electrode bus bar 4P and the positive electrode terminal 21P on the coexisting part 41P and the connection 11N between the negative electrode bus bar 4N and the negative electrode terminal 21N on the coexisting part 41N are equivalent in Z-directional position. Consequently, connection work can be readily performed at each of the connections 11P and 11N. For example, in the case of joining with laser welding, welding work can be efficiently performed. As a result, the productivity of the power conversion apparatus 1 is improved.

The output bus bar 4O has the output interposition part 41O placed in the space between the output terminals 21O which face each other. Both the output terminal 21O of the first semiconductor module 2P and the output terminal 21O of the second semiconductor module 2N are connected to the output interposition part 41O. Consequently, the current path between the output terminal 21O of the first semiconductor module 2P and the output terminal 21O of the second semiconductor module 2N can be shortened. Therefore, the inductance can be more effectively reduced.

The output interposition part 41O and the coexisting parts 41P and 41N placed between the first semiconductor module 2P and the second semiconductor module 2N adjacent to each other have the connections 11O, 11P, and 11N with the corresponding power terminals 21 at equivalent positions in the Z direction. Consequently, connection work can be readily performed at each of the connections 11P and 11N. Thus, the productivity of the power conversion apparatus 1 can be further improved.

The output interposition part 41O has the base 451 and a pair of erecting parts 452. The base 451 is closer in the Z direction to the module bodies 20 than to the ends of the power terminals 21. Consequently, the current loop including the output interposition part 41O, the power terminals 21, and the switching elements and internal wirings inside the module bodies 20 can be reduced in length. As a result, the inductance can be further reduced.

The positive electrode bus bar 4P and the negative electrode bus bar 4N are integrated with the capacitor 53. Therefore, the number of components of the power conversion apparatus 1 can be reduced. In addition, the current path between the capacitor 53 and the semiconductor modules 2 can be easily simplified, so that the inductance can be easily reduced.

As described above, the present embodiment can provide a power conversion apparatus that can easily reduce inductance.

Second Embodiment

Figure 9:
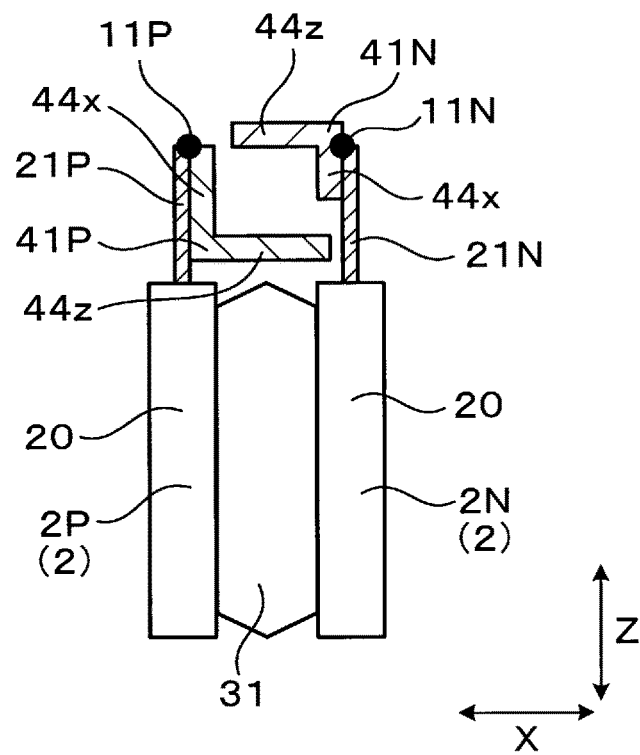
FIG. 9 is a cross-sectional view of semiconductor modules and coexisting parts according to the second embodiment.

In the present embodiment, the protruding facing part 44z of one of a pair of coexisting parts 41P and 41N is placed farther from the module body 20 than the connection is, as illustrated in FIG. 9.

In the present embodiment, the protruding facing part 44z of the coexisting part 41N of the negative electrode bus bar 4N is placed farther from the module body 20 than the connection 11N is. The protruding facing part 44z of the negative electrode bus bar 4N is farther from the module body 20 than the end of the negative electrode terminal 21N is.

The arrangement facing part 44x of the coexisting part 41N is closer to the module body 20 than the protruding facing part 44z of the coexisting part 41N is.

At the coexisting part 41P of the positive electrode bus bar 4P, the protruding facing part 44z is placed closer to the module body 20 than the connection 11P is. Specifically, at the coexisting part 41P, which is one of a pair of coexisting parts 41P and 41N whose protruding facing part 44z is closer to the module body 20 than the protruding facing part 44z of the other coexisting part is, the protruding facing part 44z is placed closer to the module body 20 than the connection 11P is, as is the case in the first embodiment.

Other configurations are the same as those of the first embodiment.

Unless otherwise noted, the reference signs used in the second and subsequent embodiments represent the same components as those in the previous embodiments.

In the present embodiment, like in the preceding embodiment, a pair of coexisting parts 41P and 41N are at least partially placed between a pair of power terminals 21. Consequently, the inductance can be reduced. The pair of coexisting parts 41P and 41N have the arrangement facing parts 44x and the protruding facing parts 44z. Consequently, the inductance can be effectively reduced.

At the coexisting part 41P, whose protruding facing part 44z is closer to the module body 20 than that of the coexisting part 41N is, the protruding facing part 44z is placed closer to the module body 20 than the connection 11P is. Consequently, the current loop formed by the switching element and internal wirings inside the module body 20, the coexisting part 41P, and the power terminal 21 can be reduced in length. As a result, the inductance can be reduced.

Other effects are the same as those of the first embodiment.

Third Embodiment

Figure 10:
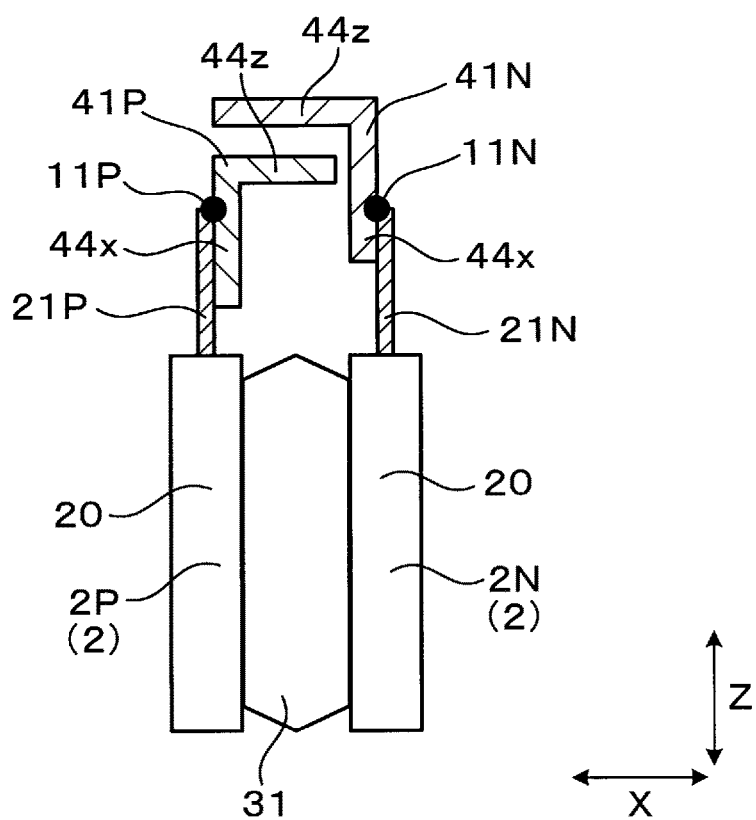
FIG. 10 is a cross-sectional view of semiconductor modules and coexisting parts according to the third embodiment.

In the present embodiment, the protruding facing parts 44z of both of a pair of coexisting parts 41P and 41N are placed farther from the module bodies 20 than the connections 11P and 11N are, as illustrated in FIG. 10.

The protruding facing parts 44z are placed farther from the module bodies 20 than the arrangement facing parts 44x are. The pair of protruding facing parts 44z are farther from the module bodies 20 than the ends of the power terminals 21 are.

The pair of protruding facing parts 44z are placed close to each other and face each other in the Z direction.

Other configurations are the same as those of the first embodiment.

In the present embodiment, like in the preceding embodiments, a pair of coexisting parts 41P and 41N are at least partially placed between a pair of power terminals 21. Consequently, the inductance can be reduced. The pair of coexisting parts 41P and 41N have the arrangement facing parts 44x and the protruding facing parts 44z. Consequently, the inductance can be effectively reduced.

In the present embodiment, in particular, at the coexisting part 41P, which is one of a pair of coexisting parts 41P and 41N whose protruding facing part 44z is closer to the module body 20 than the protruding facing part 44z of the other coexisting part is, the protruding facing part 44z is placed farther from the module body 20 than the connection 11P is. Consequently, the distance between the protruding facing parts 44z and the cooling pipe 31 is ensured, so that the insulation therebetween can be easily ensured.

Other effects are the same as those of the first embodiment.

Fourth Embodiment

Figure 11:
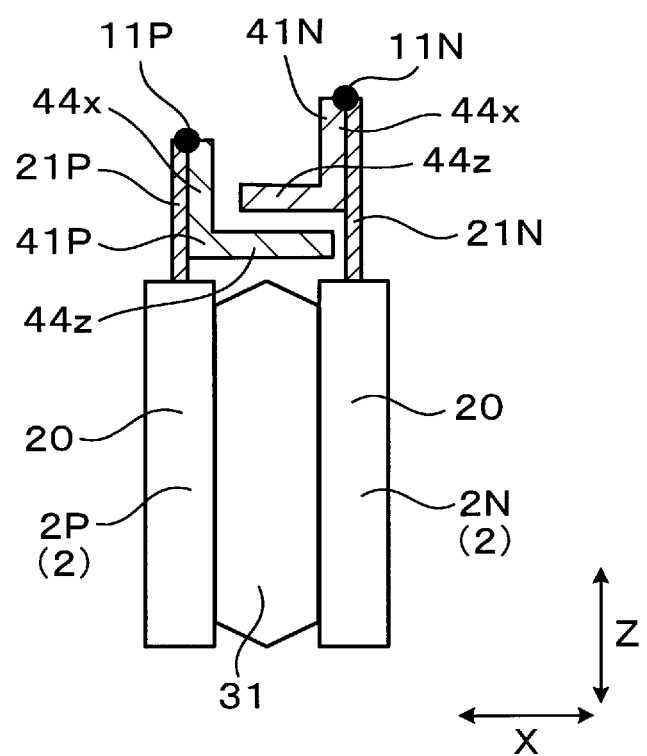
FIG. 11 is a cross-sectional view of semiconductor modules and coexisting parts according to the fourth embodiment.

In the present embodiment, the connection 11P between the positive electrode bus bar 4P and the positive electrode terminal 21P on the coexisting part 41P and the connection 11N between the negative electrode bus bar 4N and the negative electrode terminal 21N on the coexisting part 41N differ in Z-directional position, as illustrated in FIG. 11.

In particular, at the coexisting part 41P, whose protruding facing part 44z is closer to the module body 20 than that of the coexisting part 41N, the connection 11P is closer to the module body 20 than that at the other coexisting part 41N is. The current path on the positive electrode terminal 21P from the module body 20 to the connection 11P can be made as short as possible. As a result, the inductance can be reduced.

Specifically, from the perspective of connectivity and the like, it is desirable that the arrangement facing parts 44x have a certain Z-directional length that is not too short. The positive electrode side coexisting part 41P, whose protruding facing part 44z is closer to the module body 20 than that of the coexisting part 41N is, can ensure connectivity even when the end of the arrangement facing part 44x is provided relatively close to the module body 20. Therefore, the positive side connection 11P is provided as close as possible to the module body 20. In contrast, on the negative electrode side, the arrangement facing part 44x cannot have a sufficiently long Z-directional length unless the connection 11N is located away from the module body 20 to some extent. For this reason, the positive electrode side connection 11P is placed as close as possible to the module body 20, and accordingly located closer to the module body 20 than the negative side connection 11N is.

Other configurations are the same as those of the first embodiment.

In the present embodiment, as described above, the inductance can be further reduced. Other effects are the same as those of the first embodiment.

Fifth Embodiment

Figure 12:
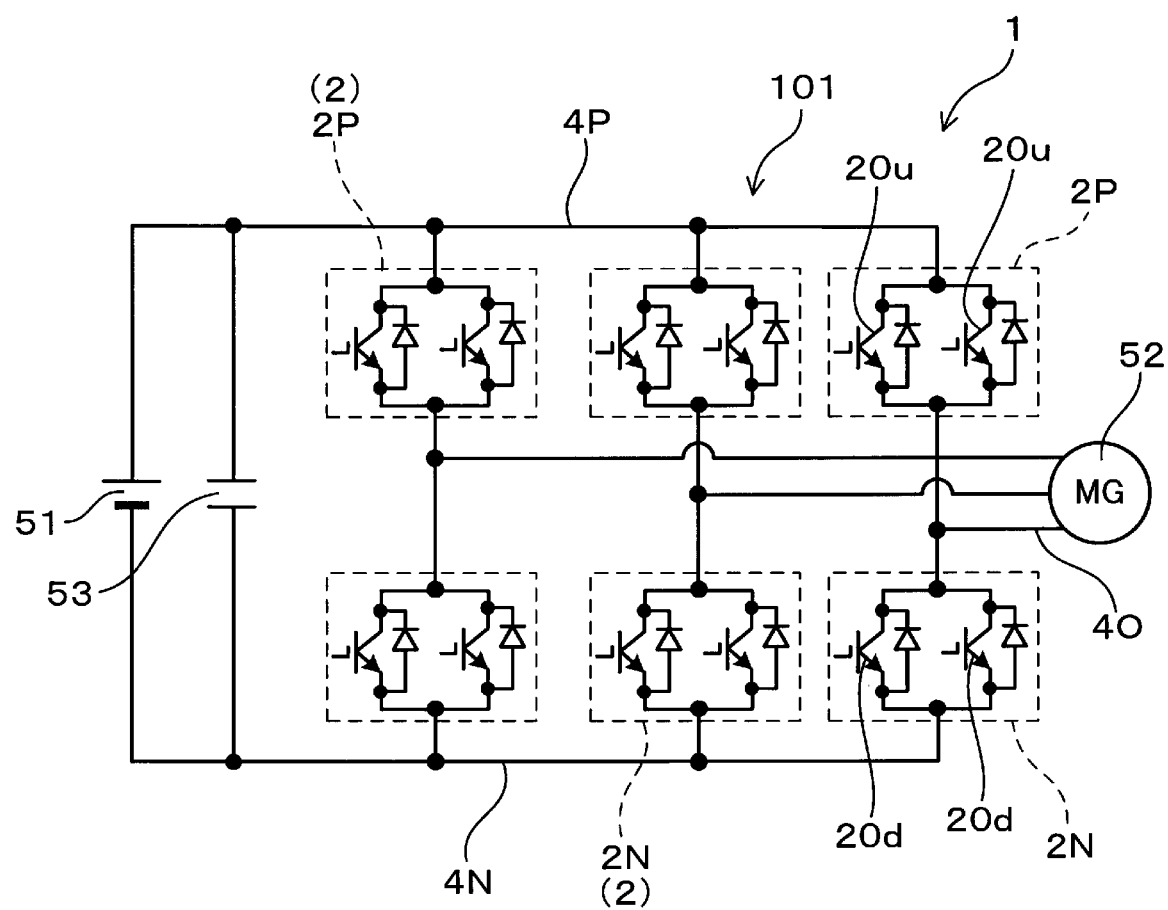
FIG. 12 is a circuit diagram of a power conversion apparatus according to the fifth embodiment.

In the present embodiment, each of the first semiconductor modules 2P and the second semiconductor modules 2N incorporates a plurality of switching elements connected in parallel, as illustrated in FIG. 12.

Specifically, the first semiconductor modules 2P each include a plurality of upper-arm switching elements 20u connected in parallel. Similarly, the second semiconductor modules 2N each include a plurality of lower-arm switching elements 20d connected in parallel.

Other configurations are the same as those of the first embodiment.

In the present embodiment, the allowable value of current flowing through each arm can be increased. Therefore, a power conversion apparatus 1 with higher output can be obtained.

Other effects are the same as those of the first embodiment.

In the example described in the present embodiment, each semiconductor module 2 incorporates two switching elements connected in parallel. Alternatively, each semiconductor module 2 may incorporate three or more switching elements connected in parallel. Switching elements of the same type or switching elements of different types may be connected in parallel and incorporated.

For example, one semiconductor module 2 may include a SiC-MOSFET and a Si-IGBT connected in parallel. A SiC-MOSFET is a MOSFET formed of SiC (i.e. silicon carbide). A Si-IGBT is an IGBT formed of Si (i.e. silicon).

Note that at least one of the first semiconductor modules 2P and the second semiconductor modules 2N may incorporate a plurality of switching elements connected in parallel.

In the above embodiments, the coexisting part of the positive electrode bus bar is closer to the module body than the coexisting part of the negative electrode bus bar is. However, the present disclosure is not limited to this positional relation. Specifically, in other embodiments, the coexisting part of the negative electrode bus bar can be closer to the module body than the coexisting part of the positive electrode bus bar is. Alternatively, a pair of coexisting parts may be placed at the same distance from the module bodies.

The present disclosure is not limited to the above embodiments, and can be applied to various embodiments without departing from the gist of the disclosure.

The present disclosure has been described with reference to the embodiments, but it is to be understood that the present disclosure is not limited to the embodiments and structures. The present disclosure covers various modifications and equivalent variations. In addition to various combinations and forms, other combinations and forms including one or more/less elements thereof are also within the spirit and scope of the present disclosure.

An aspect of the present disclosure is a power conversion apparatus (1) including a switching circuit unit (101) having a plurality of upper-arm switching elements (20u) connected to a positive electrode wiring and a plurality of lower-arm switching elements (20d) connected to a negative electrode wiring, the power conversion apparatus including:

a plurality of bus bars (4); and a plurality of semiconductor modules (2) each including power terminals (21) protruding from a module body (20), wherein as the bus bars, a positive electrode bus bar (4P) that configures the positive electrode wiring and a negative electrode bus bar (4N) that configures the negative electrode wiring are provided, as the semiconductor modules, a first semiconductor module (2P) and a second semiconductor module (2N) are provided, the first semiconductor module incorporating one of the upper-arm switching elements and including a positive electrode terminal (21P) that is the power terminal connected to the positive electrode bus bar, the second semiconductor module incorporating one of the lower-arm switching elements and including a negative electrode terminal (21N) that is the power terminal connected to the negative electrode bus bar, the first semiconductor module and the second semiconductor module are placed such that the positive electrode terminal and the negative electrode terminal face each other in a direction orthogonal to a protruding direction, the positive electrode bus bar and the negative electrode bus bar respectively have coexisting parts (41P, 41N) placed together between the positive electrode terminal and the negative electrode terminal as seen in the protruding direction of the power terminals, and the coexisting parts are at least partially placed in a space between the positive electrode terminal and the negative electrode terminal, the power conversion apparatus further including an output bus bar (4O) that configures an output wiring, wherein the semiconductor modules each include an output terminal (21O) connected to the output bus bar as one of the power terminals, the output terminals of the first semiconductor module and the second semiconductor module face each other, the output bus bar has an output interposition part (41O) placed in a space between the output terminals which face each other, and both the output terminal of the first semiconductor module and the output terminal of the second semiconductor module are connected to the output interposition part.

In the power conversion apparatus, the positive electrode bus bar and the negative electrode bus bar respectively have the coexisting parts. The coexisting parts are at least partially placed in the space between the positive electrode terminal and the negative electrode terminal which face each other. With this configuration, the positive electrode bus bar and the negative electrode bus bar are placed close to each other at the coexisting parts. As a result, the inductance of the bus bars can be reduced.

As described above, the above aspect can provide a power conversion apparatus that can easily reduce inductance.

What is claimed is:

1. A power conversion apparatus including a switching circuit unit having a plurality of upper-arm switching elements connected to a positive electrode wiring and a plurality of lower-arm switching elements connected to a negative electrode wiring, the power conversion apparatus comprising:

a plurality of bus bars; and a plurality of semiconductor modules each including power terminals protruding from a module body, wherein as the bus bars, a positive electrode bus bar that configures the positive electrode wiring and a negative electrode bus bar that configures the negative electrode wiring are provided, as the semiconductor modules, a first semiconductor module and a second semiconductor module are provided, the first semiconductor module incorporating one of the upper-arm switching elements and including a positive electrode terminal that is the power terminal connected to the positive electrode bus bar, the second semiconductor module incorporating one of the lower-arm switching elements and including a negative electrode terminal that is the power terminal connected to the negative electrode bus bar, the first semiconductor module and the second semiconductor module are placed such that the positive electrode terminal and the negative electrode terminal face each other in a direction orthogonal to a protruding direction of the power terminals, the positive electrode bus bar and the negative electrode bus bar respectively have coexisting parts placed together between the positive electrode terminal and the negative electrode terminal as seen in the protruding direction of the power terminals, the coexisting parts are at least partially placed in a space between the positive electrode terminal and the negative electrode terminal, the power conversion apparatus further comprises an output bus bar that configures an output wiring, the semiconductor modules each include an output terminal connected to the output bus bar as one of the power terminals, the output terminals of the first semiconductor module and the second semiconductor module face each other, the output bus bar has an output interposition part placed in a space between the output terminals which face each other, the output interposition part has a base and a pair of erecting parts, the base having a main surface facing in the protruding direction of the power terminals, the erecting parts are erected in the protruding direction of the power terminals from the base, the base is closer in the protruding direction of the power terminals to the module bodies than to an end of the output terminals, and both the output terminal of the first semiconductor module and the output terminal of the second semiconductor module are connected to the output interposition part.

2. The power conversion apparatus according to claim 1, wherein
the coexisting parts have facing parts that are placed such that main surfaces of the coexisting parts face each other.

3. The power conversion apparatus according to claim 2, wherein
the coexisting parts have, as the facing parts, arrangement facing parts that face each other in an arrangement direction of the positive electrode terminal and the negative electrode terminal.

4. The power conversion apparatus according to claim 2, wherein
the coexisting parts have, as the facing parts, protruding facing parts that face each other in the protruding direction of the power terminals.

5. The power conversion apparatus according to claim 4, wherein the coexisting parts have, as the facing parts, arrangement facing parts that face each other in an arrangement direction of the positive electrode terminal and the negative electrode terminal, and the protruding facing parts.

6. The power conversion apparatus according to claim 5, wherein
a distance d1 between the protruding facing parts of a pair of the coexisting parts is smaller than a distance d2 between the arrangement facing parts of the pair of coexisting parts.

7. The power conversion apparatus according to claim 5, wherein
a length L1 of the protruding facing parts in the arrangement direction of the positive electrode terminal and the negative electrode terminal is longer than a length L2 of the arrangement facing parts in the protruding direction of the power terminals.

8. The power conversion apparatus according to claim 4, wherein
at one of the pair of coexisting parts whose protruding facing part is closer to the module bodies than is the protruding facing part of the other coexisting part, the protruding facing part is placed closer to the module bodies than is a connection with the power terminal.

9. The power conversion apparatus according to claim 4, wherein
at one of the pair of coexisting parts whose protruding facing part is closer to the module bodies than is the protruding facing part of the other coexisting part, the protruding facing part is placed farther from the module bodies than is a connection with the power terminal.

10. The power conversion apparatus according to claim 1, wherein
at least one of the first semiconductor module and the second semiconductor module includes a plurality of switching elements connected in parallel.

11. The power conversion apparatus according to claim 1, wherein
a cooling pipe including an internal refrigerant flow channel is interposed between the first semiconductor module and the second semiconductor module which are placed so as to be adjacent to each other.

12. The power conversion apparatus according to claim 1, wherein
a connection between the positive electrode bus bar and the positive electrode terminal on the coexisting parts and a connection between the negative electrode bus bar and the negative electrode terminal on the coexisting parts are equivalent in position in the protruding direction of the power terminals.

13. The power conversion apparatus according to claim 1, wherein
a connection between the positive electrode bus bar and the positive electrode terminal on the coexisting parts and a connection between the negative electrode bus bar and the negative electrode terminal on the coexisting parts differ in position in the protruding direction of the power terminals.

14. The power conversion apparatus according to claim 1, wherein
the output interposition part and the coexisting parts placed between the first semiconductor module and the second semiconductor module adjacent to each other have connections with the corresponding power terminals at equivalent positions in the protruding direction of the power terminals.

* * * * *